United States Patent
Gong et al.

(10) Patent No.: US 10,068,841 B2
(45) Date of Patent: Sep. 4, 2018

(54) APPARATUS AND METHODS FOR MULTI-DIE PACKAGING

(71) Applicant: NXP USA, Inc., Austin, TX (US)

(72) Inventors: Zhiwei Gong, Chandler, AZ (US); Wei Gao, Tianjin (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/630,633

(22) Filed: Jun. 22, 2017

(65) Prior Publication Data

US 2017/0317020 A1 Nov. 2, 2017

Related U.S. Application Data

(62) Division of application No. 15/142,644, filed on Apr. 29, 2016, now Pat. No. 9,721,881.

(51) Int. Cl.

| | |
|---|---|
| *H01L 23/495* | (2006.01) |
| *H01L 23/498* | (2006.01) |
| *H01L 21/48* | (2006.01) |
| *H01L 23/00* | (2006.01) |
| *H01L 25/16* | (2006.01) |
| *H05K 1/11* | (2006.01) |
| *H05K 3/34* | (2006.01) |
| *H05K 1/18* | (2006.01) |

(52) U.S. Cl.
CPC .... *H01L 23/49838* (2013.01); *H01L 21/4853* (2013.01); *H01L 23/49816* (2013.01); *H01L 24/09* (2013.01); *H01L 25/162* (2013.01); *H05K 1/115* (2013.01); *H05K 1/181* (2013.01); *H05K 3/34* (2013.01); *H05K 3/3436* (2013.01); *H01L 2224/04042* (2013.01); *H01L 2224/48091* (2013.01); *H05K 2201/10674* (2013.01); *H05K 2201/10734* (2013.01)

(58) Field of Classification Search
CPC ......... H01L 24/16; H01L 24/13; H01L 24/81; H01L 23/49816; H01L 23/49838; H01L 23/49513; H01L 24/09
USPC ........................................................ 257/668
See application file for complete search history.

(56) References Cited

U.S. PATENT DOCUMENTS

| | | | |
|---|---|---|---|
| 8,513,792 B2 * | 8/2013 | Ganesan | H01L 21/50 257/686 |
| 2009/0014859 A1 * | 1/2009 | Jeung | H01L 21/4853 257/686 |

* cited by examiner

*Primary Examiner* — Theresa T Doan

(57) ABSTRACT

A semiconductor device assembly includes an interposer having an opening extending from a first major surface to a second major surface of the interposer and a plurality of external connectors on the second major surface. The first major surface of the interposer is attached to a packaged semiconductor device. The opening of the interposer exposes the packaged semiconductor device.

20 Claims, 4 Drawing Sheets

APPARATUS AND METHODS FOR MULTI-DIE PACKAGING

BACKGROUND

Field

This disclosure relates generally to semiconductor device packaging, and more specifically, to packages with multiple semiconductor die.

Related Art

Package substrates for semiconductor devices such as leadframes and ceramic or laminate substrates provide a central supporting structure of molded IC packages to which all other elements of the molded IC package are attached. Package substrates are etched, stamped or formed with a thin sheet of material with a pattern of terminals around a central die attach platform upon which a die is mounted using, for example, an epoxy resin. The die includes bonding pads which are electrically connected to the surrounding lead terminals of the frame by conductive wires using well-established wirebond techniques. The assembly including the package substrate, die, and wires are covered with encapsulant material to complete the molded IC package.

The demand for smaller devices with higher throughput and capability is ever increasing. Thus, there is a continuing need to find ways to fit more semiconductor processing, memory, and/or sensor devices in the smallest space possible including stacking an IC package on top of another IC package, which is referred to as package on package (PoP) technology. The typical PoP arrangement is the memory package mounted on top of processor. The connections between two packages with various PoP technologies all rely on solder balls, e.g. flip chip PoP, ball grid array (BGA) PoP and through mold via (TMV) PoP. With the growth of complexity of processors and density of memory, a fine pitch connection between two packages is required, however the stand-off or distance between packages required for the top package may prevent smaller solder ball size to achieve finer pitch, e.g. 0.25 mm solder ball for 0.4 mm pitch. At same time, the solder ball size constrains thickness of the bottom package which limits the size of the processor and increases the packaging cost.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Methods disclosed herein provide a packaged semiconductor assembly with one or more die, wirebonds and encapsulant on package substrates or other suitable packaging technologies stacked one on top of the other with an interposer in between. The interposer provides connections between the packages while providing sufficient space between the packages to accommodate the height of all components mounted to the surface of the bottom package.

Figure 1:
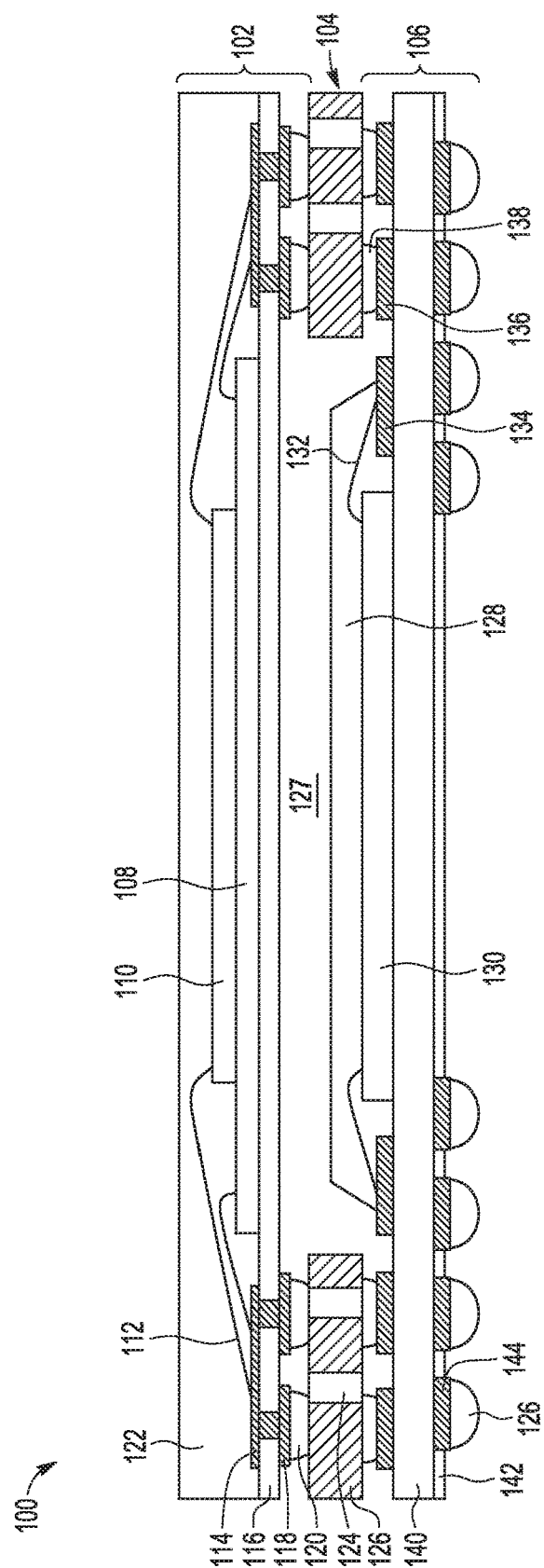
FIG. 1 shows a side cross-sectional view of an embodiment of a PoP packaged semiconductor assembly with multiple die.

Referring now to FIG. 1, a cross-sectional side view of an embodiment of package on package (PoP) semiconductor devices 100 including a first packaged semiconductor device 102, a second packaged semiconductor device 106, and an interposer 104 between the first and second packaged semiconductor devices 102, 106. In first packaged semiconductor device 102, first integrated circuit (IC) die 108 is mounted on package substrate 116 and second IC die 110 is mounted on a surface of IC die 108. In other embodiments, die 108, 110 may be mounted side by side or other suitable configuration. IC die 108, 110 may be mounted using die attach material with or without heat dissipating or conducting properties. Die 108, 110 may include any type of integrated circuitry that performs any suitable type of function such a System on a Chip, microprocessor, memory, sensor, or other suitable circuitry. Die attach material may be any suitable material such as epoxy, tape, solder, or other suitable material.

In device 102, package substrate 116 may be a ball grid array substrate, flip chip substrate, leadframe or build up structures that is formed, stamped and/or etched from metal, ceramic, plastic or other suitable material. Other suitable structures and materials can be used for package substrate 116, however. Wirebonds 112 are formed between die 108, 110 and conductive pads or bond pads 114 of package substrate 116 to form electrical connections between die 108, 110 and bond pads 114. Bond pads 114, wirebonds 122, and die 108, 110 are encased in encapsulant 122 on one side of device 102 to protect the encapsulated components from corrosive materials or other damage. Other suitable technology like flip chip or fan-out wafer level packaging can be used to interconnect die 108, 110 to substrate 116. Solder balls 120 on conductive contacts 118 on another side of device 102 allow device 102 to be electrically coupled or connected to interposer 104. Conductive contacts 118 are coupled to bond pads 114 by conductive vias or interconnects in dielectric or electrically insulating material of substrate 116.

Interposer 104 includes electrically conductive vias or interconnects 124 in dielectric material 126 around a perimeter of opening 127 in dielectric material 126. Vias 124 are positioned to contact respective solder balls 120, which are attached to contacts 118, on one side, and to contact respective solder balls 138, which are attached to contacts 136 on second IC device 106. Opening 127 is sized, shaped and positioned to accommodate die 130 on second IC device 106.

In second packaged semiconductor device 106, third integrated circuit (IC) die 130 is mounted on package substrate 140. IC die 130 may be mounted using die attach material with or without heat dissipating or conducting properties. Die 130 may include any type of integrated circuitry that performs any suitable type of function such a System on a Chip, microprocessor, memory, sensor, or other suitable circuitry. Die attach material may be epoxy, tape, solder, or other suitable material.

In device 106, package substrate 140 may be a ball grid array substrate, flip chip substrate, leadframe or build up structures that is formed, stamped and/or etched from metal, ceramic, plastic or other suitable material. Other suitable structures and materials can be used for package substrate 140, however. Wirebonds 132 are formed between die 130 and conductive pads or bond pads 134 on package substrate 140 to form electrical connections between die 130 and the bond pads 134. Bond pads 134, wirebonds 132, and die 130 are encased in encapsulant 128 on one side of device 106 to protect the encapsulated components from corrosive materials or other damage. Other suitable technology like flip chip or fan-out wafer level packaging can be used to interconnect die 130 to substrate 140.

Another side of device 106 includes solder balls 146 on conductive contacts 144 that allow device 106 to be electrically coupled or connected to another substrate, such as a printed circuit board or other suitable structure. Conductive contacts 144 are coupled to respective bond pads 134 and contacts 136 by conductive vias or interconnects in dielectric or electrically insulating material of substrate 140.

Figure 2:
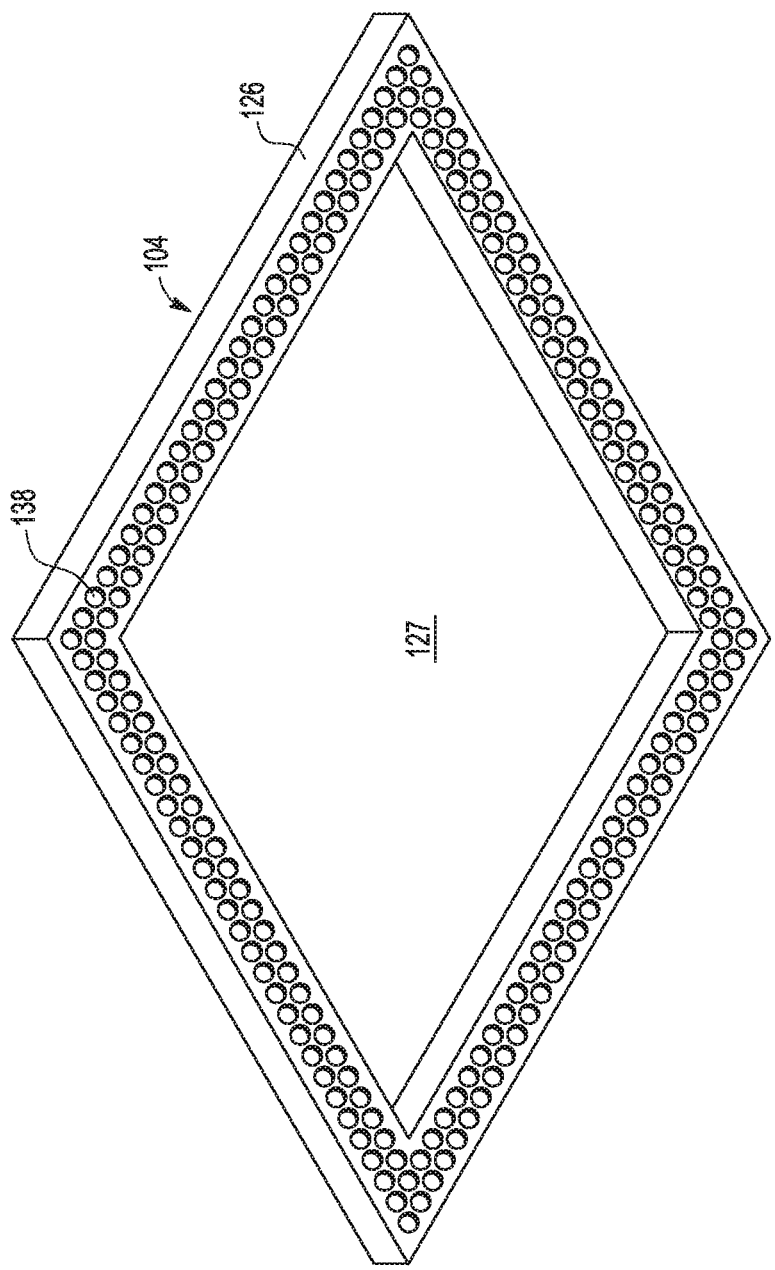
FIG. 2 shows a perspective view of an embodiment of a frame interposer that may be used in the PoP semiconductor device of FIG. 1.

FIG. 2 shows a perspective view of an embodiment of a frame interposer 104 that may be used in the PoP semiconductor device 100 of FIG. 1. The thickness of dielectric material 126 and vias 124 are selected to provide sufficient clearance in opening 127 for components on IC device 106, such as die 130, wirebonds 132, and encapsulant 128. By allowing the space between IC devices 102, 106 to be determined by the thickness of interposer 104, solder balls 120 and 138 can be as small as necessary to meet the desired pitch or spacing between solder balls 120 on IC devices 102 and 106. Additionally, the height of IC device 106, wirebonds 132 and encapsulant 128 is not limited by the size/height of solder balls 120, 138.

In selected embodiments, solder balls 138 are formed on dielectric material 126 of interposer 104 before solder balls 138 are attached to contacts 136 of IC device 106. In the example shown, two rows of solder balls 138 are formed on dielectric material 126 around the perimeter of opening 127, however, any suitable number of rows of solder balls 138 can be used. Once solder balls 138 on interposer 104 are attached to contacts 136 on IC device 106, solder balls 120 on IC device 102 can be attached to contacts (not shown) on interposer 104. Alternatively IC 106, interposer 104 and IC 102 can be co-assembled onto PCB with a single reflow, e.g. stack them on PCB then run reflow together. With vias or interconnects 124 being coupled to solder balls 120, 138, signals can be communicated between IC devices 102, 106, as well as through interconnects, contacts 144, and solder balls 146.

Figure 3:
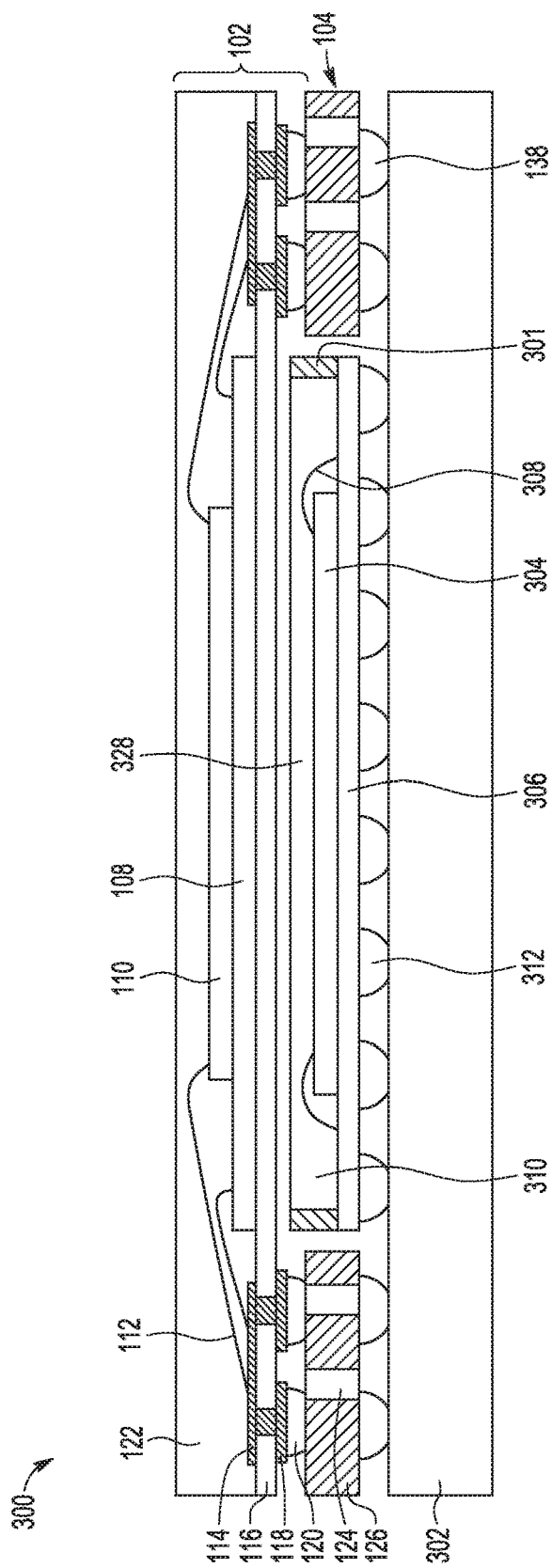
FIG. 3 shows a side cross-sectional view of another embodiment of high stand-off semiconductor devices with other electrical elements underneath and mounted on PCB.

FIG. 3 shows a side cross-sectional view of another embodiment of a high stand-off semiconductor device 300 including a first packaged semiconductor device 102, a second packaged semiconductor device 301, and an interposer 104 between the first and second packaged semiconductor devices 102, 301. In this embodiment, multiple packages and components can be arranged in the opening 127 of interposer 104, especially some tall or high components. First packaged semiconductor device 102 is the same or similar to that described for FIG. 1 herein.

In second packaged semiconductor device 301, third integrated circuit (IC) die 304 is mounted on package substrate 306. IC die 304 may be mounted using die attach material with or without heat dissipating or conducting properties. Die 304 may include any type of integrated circuitry that performs any suitable type of function such a System on a Chip, microprocessor, memory, sensor, or other suitable circuitry. Die attach material may be epoxy, tape, solder, or other suitable material. Package substrate 306 is attached to substrate 302, which may be a printed circuit board or other suitable structure. Wirebonds 308 are formed between die 304 and conductive pads or bond pads (not shown) of package substrate 302 to form electrical connections between die 304 and the bond pads. Wirebonds 308 and die 304 are encased in encapsulant 310 on one side of device 301 to protect the encapsulated components from corrosive materials or other damage.

Another side of device 301 includes contacts (not shown) on a second surface of substrate 306 with solder balls 306 attached to contacts or traces (not shown) on substrate 302. The traces or contacts on substrate 302 can be further coupled to components external to POP semiconductor device 300.

Figure 4:
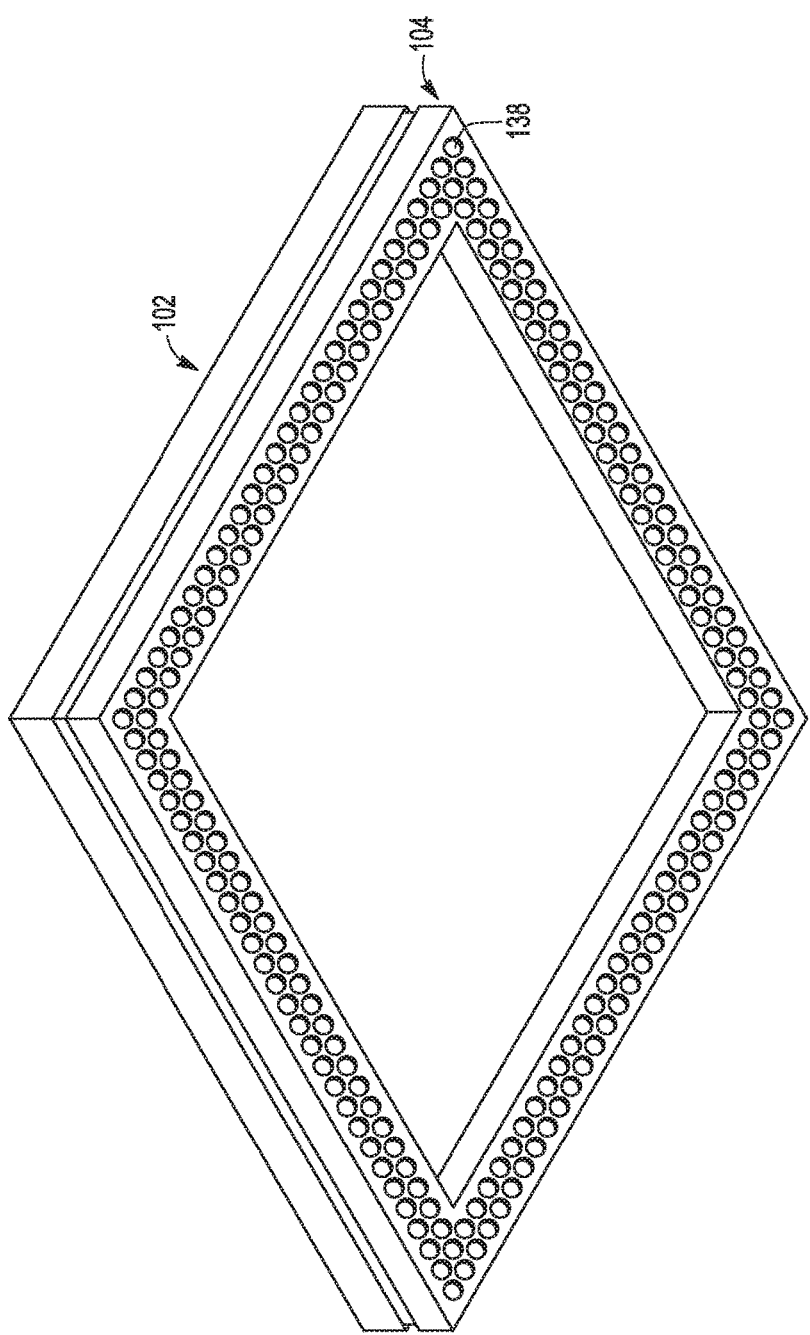
FIG. 4 shows a perspective view of an embodiment of a frame interposer attached to a top package that may be used in the semiconductor devices of FIG. 3.

Referring to FIGS. 3 and 4, FIG. 4 shows a perspective view of an embodiment of a frame interposer attached to packaged IC device 102 that may be used in the high stand-off semiconductor device 300 of FIG. 3. In selected embodiments, solder balls 138 are formed on dielectric material 126 of interposer 104 and then interposer 104 is attached to solder balls 120 of IC device 102. In the example shown, two rows of solder balls 138 are formed on dielectric material 126 around the perimeter of opening 127, however, any suitable number of rows of solder balls 138 can be used. IC device 301 is attached to substrate 302. Interposer 104 is attached to solder balls 120, and solder balls 138 of interposer 104 are attached to substrate 302. Note that multiple packages and components can be arranged in the opening 127 of interposer 104, especially tall components.

With vias or interconnects 124 being coupled to solder balls 120, 138 and 306, signals can be communicated between IC devices 102, 301 and with components coupled to substrate 302 that are external to high stand-off semiconductor device 300.

The thickness of dielectric material 126 and vias 124 are selected to provide sufficient clearance in opening 127 for components on IC device 301, such as die 304, wirebonds 308, and encapsulating material 128. By allowing the space between IC devices 102, 301 to be determined by the thickness of interposer 104, solder balls 120 and 138 can be as small as necessary to meet the desired pitch or spacing between solder balls 120 on IC devices 102 and 301. Additionally, the height of IC device 301, wirebonds 308 and encapsulating material 328 is not limited by the size/height of solder balls 120, 138.

By now it should be appreciated that in some embodiments, there has been provided methods of forming a semiconductor device assembly that can include forming an interposer having an opening extending from a first major surface to a second major surface of the interposer and a plurality of external connectors on the second major surface; and attaching the first major surface of the interposer to a packaged semiconductor device, wherein the opening of the interposer exposes the packaged semiconductor device.

In another aspect, the plurality of external connector can have a pitch in a range of 0.4 to 1.3 mm.

In another aspect, the plurality of external connectors comprises one of solder balls, solder bumps, or landing pads.

In another aspect, the attaching the first major surface of the interposer to the packaged semiconductor device is performed with a second plurality of external connectors.

In another aspect, the interposer and first plurality of external connectors is formed using ball grid array (BGA) technology or flip chip technology.

In another aspect, the method can further comprise, after the attaching the first major surface of the interposer to the packaged semiconductor device, attaching the first plurality of external connectors to a printed circuit board (PCB). The interposer is between the packaged semiconductor device and the PCB.

In another aspect, the method can further comprise, prior to attaching the first plurality of solder balls to the PCB, attaching a set of components to the PCB, wherein, after the attaching the first plurality of external connectors to the PCB, the opening surrounds the set of components.

In another aspect, the set of components comprises a second packaged semiconductor device.

In another aspect, the set of components comprises a passive device.

In another aspect, the opening completely surrounds the set of components.

In another aspect, the packaged semiconductor device comprises a plurality of semiconductor die.

In another aspect, the interposer and the plurality of external connectors together has a thickness in a range of 0.1 mm to 1 mm.

In other embodiments, a semiconductor device assembly can include a packaged semiconductor device; and an interposer having a first major surface attached to the packaged semiconductor device. The interposer has an opening extending from the first major surface to a second major surface of the interposer and a plurality of external connectors on the second major surface. The opening of the interposer exposes the packaged semiconductor device.

In another aspect, the semiconductor device assembly can further comprise a second plurality of external connectors attached between the packaged semiconductor substrate and the first major surface of the interposer.

In another aspect, the plurality of external connectors has a pitch in a range of 0.2 mm to 1.3 mm.

In another aspect, the semiconductor device assembly can further comprise a PCB, wherein the plurality of solder balls is attached to the PCB. The interposer is between the packaged semiconductor device and the PCB.

In another aspect, the semiconductor device assembly can further comprise a set of components attached to the PCB, wherein the opening surrounds the set of components.

In further embodiments, a method of forming a semiconductor device assembly can include attaching an interposer to a package substrate of a first packaged semiconductor device having a first die. The interposer can include an opening and a plurality of solder balls attached to a first major surface of the interposer prior to the attaching the interposer to the first packaged semiconductor device. The interposer can be attached such that the opening surrounds the first die. A second packaged semiconductor device can be attached to a second major surface of the interposer.

In another aspect, the first die can be attached to a first major surface of the package substrate and the attaching the interposer to the package substrate comprises attaching each solder ball of the plurality of solder balls to a bond pad on the first major surface of the package substrate.

In another aspect, attaching the second packaged semiconductor die to the second major surface of the interposer can comprise attaching the second package semiconductor die to the second major surface of the interposer using a second plurality of solder balls.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device assembly, comprising:
    an interposer having an opening extending from a first major surface to a second major surface of the interposer and a plurality of external connectors on the second major surface, wherein the external connectors are directly attached to conductive vias that extend from the first major surface to the second major surface of the interposer; the first major surface of the interposer is attached to a packaged semiconductor device, and the opening of the interposer exposes the packaged semiconductor device.

2. The semiconductor device assembly of claim 1, wherein the plurality of external connector has a pitch in a range of 0.4 to 1.3 mm.

3. The semiconductor device assembly of claim 1, wherein the plurality of external connectors comprises one of solder balls, solder bumps, or landing pads.

4. The semiconductor device assembly of claim 1, wherein the first major surface of the interposer to the packaged semiconductor device is attached with a second plurality of external connectors.

5. The semiconductor device assembly of claim 1, wherein the interposer and first plurality of external connectors is formed using ball grid array (BGA) technology or flip chip technology.

6. The semiconductor device assembly of claim 1, wherein:

the first plurality of external connectors are attached to a printed circuit board (PCB), and the interposer is between the packaged semiconductor device and the PCB.

7. The semiconductor device assembly of claim 6, further comprising:
a set of components attached to the PCB, wherein, after the first plurality of external connectors are attached to the PCB, the opening surrounds the set of components.

8. The semiconductor device assembly of claim 7, wherein the set of components comprises a second packaged semiconductor device.

9. The semiconductor device assembly of claim 7, wherein the set of components comprises a passive device.

10. The semiconductor device assembly of claim 7, wherein the opening completely surrounds the set of components.

11. The semiconductor device assembly of claim 1, wherein the packaged semiconductor device comprises a plurality of semiconductor die.

12. The semiconductor device assembly of claim 1, wherein the interposer and the plurality of external connectors together has a thickness in a range of 0.1 mm to 1 mm.

13. A semiconductor device assembly comprising:
a packaged semiconductor device; and
an interposer having a first major surface attached to the packaged semiconductor device, wherein the interposer has an opening extending from the first major surface to a second major surface of the interposer and a plurality of external connectors on the second major surface, and wherein, wherein the external connectors are directly attached to conductive vias that extend from the first major surface to the second major surface of the interposer and the opening of the interposer exposes the packaged semiconductor device.

14. The semiconductor device assembly of claim 13, further comprising:
a second plurality of external connectors attached between the packaged semiconductor substrate and the first major surface of the interposer.

15. The semiconductor device assembly of claim 13, wherein the plurality of external connectors has a pitch in a range of 0.2 mm to 1.3 mm.

16. The semiconductor device assembly of claim 13, further comprising:
a PCB, wherein the plurality of solder balls is attached to the PCB, wherein the interposer is between the packaged semiconductor device and the PCB.

17. The semiconductor device assembly of claim 16, further comprising:
a set of components attached to the PCB, wherein the opening surrounds the set of components.

18. A semiconductor device assembly, comprising:
an interposer attached to a package substrate of a first packaged semiconductor device having a first die, wherein the interposer includes an opening and a plurality of solder balls attached to conductive vias that extend from a first major surface of the interposer to a second major surface of the interposer, and wherein the interposer is attached such that the opening surrounds the first die; and
a second packaged semiconductor device attached to the second major surface of the interposer.

19. The semiconductor device assembly of claim 18, wherein the first die is attached to a first major surface of the package substrate and each solder ball of the plurality of solder balls is attached to a bond pad on the first major surface of the package substrate.

20. The semiconductor device assembly of claim 18, wherein the second package semiconductor die is attached to the second major surface of the interposer using a second plurality of solder balls.

* * * * *